US011839119B2

(12) United States Patent
Kim et al.

(10) Patent No.: US 11,839,119 B2
(45) Date of Patent: Dec. 5, 2023

(54) ADHESIVE MEMBER AND DISPLAY DEVICE INCLUDING THE SAME

(71) Applicant: Samsung Display Co., Ltd., Yongin-si (KR)

(72) Inventors: Euttum Kim, Anyang-si (KR); Sangwon Yeo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 321 days.

(21) Appl. No.: 17/035,679

(22) Filed: Sep. 29, 2020

(65) Prior Publication Data

US 2021/0134929 A1     May 6, 2021

(30) Foreign Application Priority Data

Nov. 5, 2019    (KR) ........................ 10-2019-0140061

(51) Int. Cl.
    *H10K 59/131*      (2023.01)
    *H10K 50/842*      (2023.01)

(52) U.S. Cl.
    CPC ....... *H10K 59/131* (2023.02); *H10K 50/8426* (2023.02)

(58) Field of Classification Search
None
See application file for complete search history.

(56) References Cited

U.S. PATENT DOCUMENTS

| | | | |
|---|---|---|---|
| 9,281,346 B1* | 3/2016 | Lim | ........................ H01L 24/17 |
| 10,488,720 B2 | 11/2019 | Choi et al. | |
| 2004/0165138 A1* | 8/2004 | Hwang | ............... G02F 1/13452 |
| | | | 257/E21.511 |
| 2008/0258285 A1* | 10/2008 | Harper | ................ H01L 23/3128 |
| | | | 257/E23.18 |
| 2015/0261057 A1* | 9/2015 | Harris | ................. G02F 1/16766 |
| | | | 359/290 |
| 2017/0135209 A1* | 5/2017 | Kim | ......................... H05K 1/11 |
| 2017/0256583 A1* | 9/2017 | Choi | .................... G02F 1/13452 |
| 2017/0271293 A1* | 9/2017 | Heo | ........................ H01L 24/32 |
| 2017/0309646 A1* | 10/2017 | Son | ......................... G06F 1/163 |
| 2018/0033753 A1* | 2/2018 | Camarota | ......... H01L 23/49827 |
| 2019/0041685 A1* | 2/2019 | Murakami | ........... H10K 59/129 |

FOREIGN PATENT DOCUMENTS

| | | |
|---|---|---|
| CN | 20374644 | 7/2014 |
| JP | 3549760 | 8/2004 |
| KR | 10-2017-0104716 | 9/2017 |
| KR | 10-1797001 | 11/2017 |

\* cited by examiner

*Primary Examiner* — Khaja Ahmad
(74) *Attorney, Agent, or Firm* — H.C. Park & Associates, PLC

(57) ABSTRACT

A display device includes a display substrate including a plurality of first pads arranged in a first pad area and a plurality of second pads arranged in a second pad area, wherein the first pads and the second pads are arranged in different rows from each other, a circuit board including first circuit pads facing the first pads, respectively, and second circuit pads facing the second pads, respectively, and an adhesive member disposed between the display substrate and the circuit board and including an adhesive layer and a plurality of conductive balls distributed in the adhesive layer. Here, a first density of first conductive balls overlapping the first pad area among the conductive balls is greater that a second density of second conductive balls overlapping the second pad area among the conductive balls.

20 Claims, 13 Drawing Sheets

ADHESIVE MEMBER AND DISPLAY DEVICE INCLUDING THE SAME

CROSS-REFERENCE TO RELATED APPLICATION

This application claims priority from and the benefit of Korean Patent Application No. 10-2019-0140061, filed on Nov. 5, 2019, which is hereby incorporated by reference for all purposes as if fully set forth herein.

BACKGROUND

Field

Exemplary embodiments/implementations of the invention relate generally to a display device, and more specifically, to an adhesive member and a display device including the same.

Discussion of the Background

Various display devices that are used for multimedia devices such as a television, a mobile phone, a tablet computer, a navigation unit, and a game console have been developed.

The display device includes a display panel for displaying an image. The display panel includes a plurality of gate lines, a plurality of data lines, and a plurality of pixels connected to the plurality of gate lines and the plurality of data lines. The display panel may be connected to an electronic component providing an electrical signal, which is necessary for displaying an image, to the gate lines or the data lines.

Here, the electronic component may be mounted to the display panel by using an anisotropic conductive film or an ultrasonography method.

The above information disclosed in this Background section is only for understanding of the background of the inventive concepts, and, therefore, it may contain information that does not constitute prior art.

SUMMARY

Devices constructed/methods according to exemplary implementations/embodiments of the invention are capable of improving connection reliability between a circuit board and a display panel.

According to one or more implementations/embodiments of the invention, a display device includes: a display substrate including a plurality of first pads arranged in a first pad area and a plurality of second pads arranged in a second pad area, wherein the first pads and the second pads are arranged in different rows from each other; a circuit board including first circuit pads facing the first pads, respectively, and second circuit pads facing the second pads, respectively; and an adhesive member disposed between the display substrate and the circuit board and including an adhesive layer and a plurality of conductive balls distributed in the adhesive layer. Here, a first density of first conductive balls overlapping the first pad area among the conductive balls is greater than a second density of second conductive balls overlapping the second pad area among the conductive balls.

In an embodiment, the second density may be equal to or greater than about 50% and equal to or less than about 90% of the first density.

In an embodiment, a first gap may be defined as a gap between two neighboring first pads of the first pads and a second gap may be defined as a gap between two neighboring second pads of the second pads, wherein the second gap may be greater than the first gap.

In an embodiment, a third gap between two neighboring first circuit pads of the first circuit pads may be less than a fourth gap between two neighboring second circuit pads of the second circuit pads.

In an embodiment, the first gap may correspond to the third gap, and the second gap may correspond to the fourth gap.

In an embodiment, the display substrate may include a display area and a non-display area adjacent to the display area, and the first pad area may be closer to the display area than the second pad area.

In an embodiment, the first pads may be arranged along a first direction and two neighboring first pads of the first pads may be spaced from each other in the first direction, and the second pads may be arranged along the first direction and two neighboring second pads of the second pads may be spaced from each other in the second direction, and a width of each of the second pads may be greater than that of the first pads in the first direction.

In an embodiment, a width of each of the second circuit pads may be greater than that of the first circuit pads in the first direction.

In an embodiment, the first conductive balls may be divided into a plurality of first row groups arranged in a first direction while being spaced a first spaced distance from each other, and the second conductive balls may be divided into a plurality of second row groups arranged in the first direction while being spaced a second spaced distance from each other.

In an embodiment, the second spaced distance may be greater than the first spaced distance in the first direction.

In an embodiment, the display substrate may include: a base substrate; and a circuit element layer disposed on a top surface of the base substrate and including the first pads and the second pads. Here, the second pads may be closer to an end of the base substrate than the first pads in a plan view.

In an embodiment, the circuit board may include a first portion facing the top surface of the base substrate and a second portion disposed adjacent to the first portion and facing the other surface of the base substrate.

In an embodiment of the inventive concept, a display device includes: a display substrate including a plurality of first pads arranged in a first pad area and a plurality of second pads arranged in a second pad area, wherein the first pads and the second pads are arranged in different rows from each other; a circuit board including first circuit pads facing the first pads, respectively, and second circuit pads facing the second pads, respectively; and an adhesive member disposed between the display substrate and the circuit board and including an adhesive layer and a plurality of conductive balls distributed in the adhesive layer. Here, the conductive balls include first conductive balls overlapping the first pad area and having a first density, second conductive balls overlapping a first area of the second pad area and having a second density, and third conductive balls overlapping a second area of the second pad area and having a third density, and the first area is disposed between the first pad area and the second area, and the third density is less than each of the first density and the second density.

In an embodiment, the third density may be equal to or greater than about 50% and equal to or less than about 90% of the first density or the second density.

In an embodiment, the first conductive balls may be divided into a plurality of first row groups arranged in a first direction while being spaced a first gap from each other, the second conductive balls may be divided into a plurality of second row groups arranged in the first direction while being spaced a second gap from each other, and the third conductive balls may be divided into a plurality of third row groups arranged in the first direction while being spaced a third gap from each other.

In an embodiment, the third gap may be greater than each of the first gap and the second gap.

In an embodiment, a first gap between two neighboring first pads of the first pads may be less than a second gap between two neighboring second pads of the second pads.

In an embodiment, the first density may be substantially the same as the second density.

In an embodiment of the inventive concept, an adhesive member includes: an adhesive layer including a first conductive area and a second conductive area, which are divided into different rows from each other; and a conductive group including a plurality of first conductive balls distributed in the first conductive area and a plurality of second conductive balls distributed in the second conductive area. Here, a first density of the first conductive balls overlapping the first conductive area among the conductive balls is greater than a second density of the second conductive balls overlapping the second conductive area among the conductive balls, and the second density is equal to or greater than about 50% and equal to or less than about 90% of the first density.

In an embodiment, the first conductive balls may include a plurality of first row groups arranged in a first direction while being spaced a first gap in a row unit from each other, the second conductive balls may include a plurality of second row groups arranged in the first direction while being spaced a second gap in a row unit from each other, and the second gap may be greater than the first gap.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
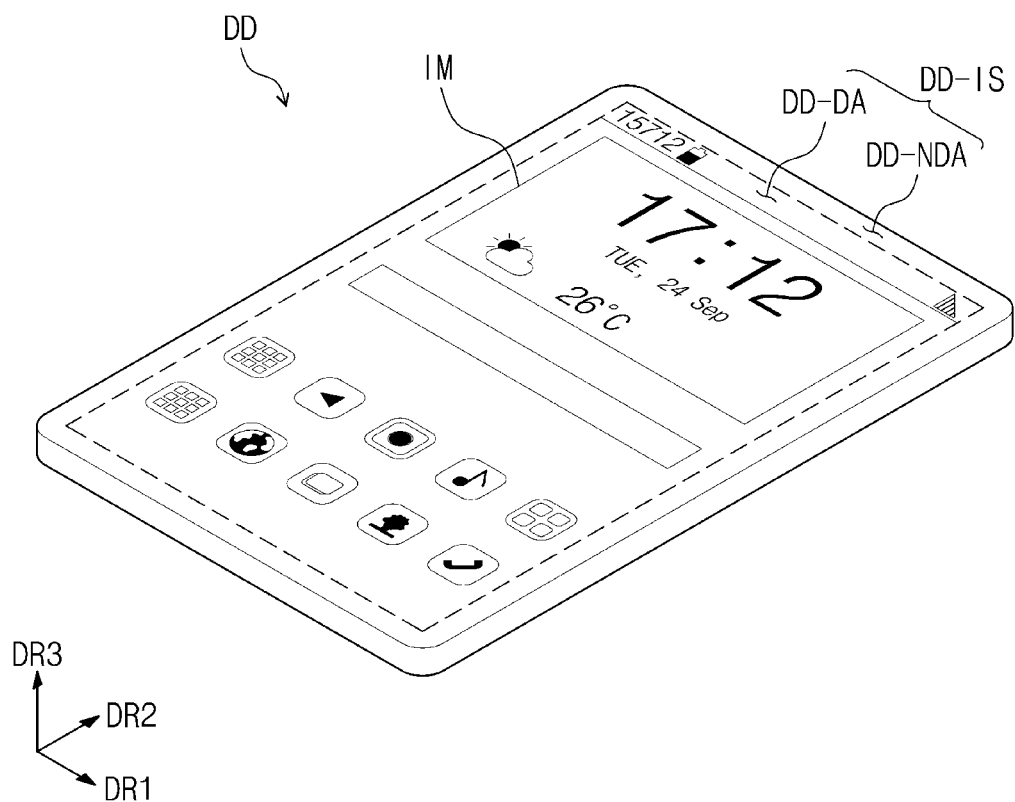
FIG. 1A is a perspective view illustrating a display device according to an embodiment of the inventive concept.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concept will be described with reference to the accompanying drawings.

Figure 1B:
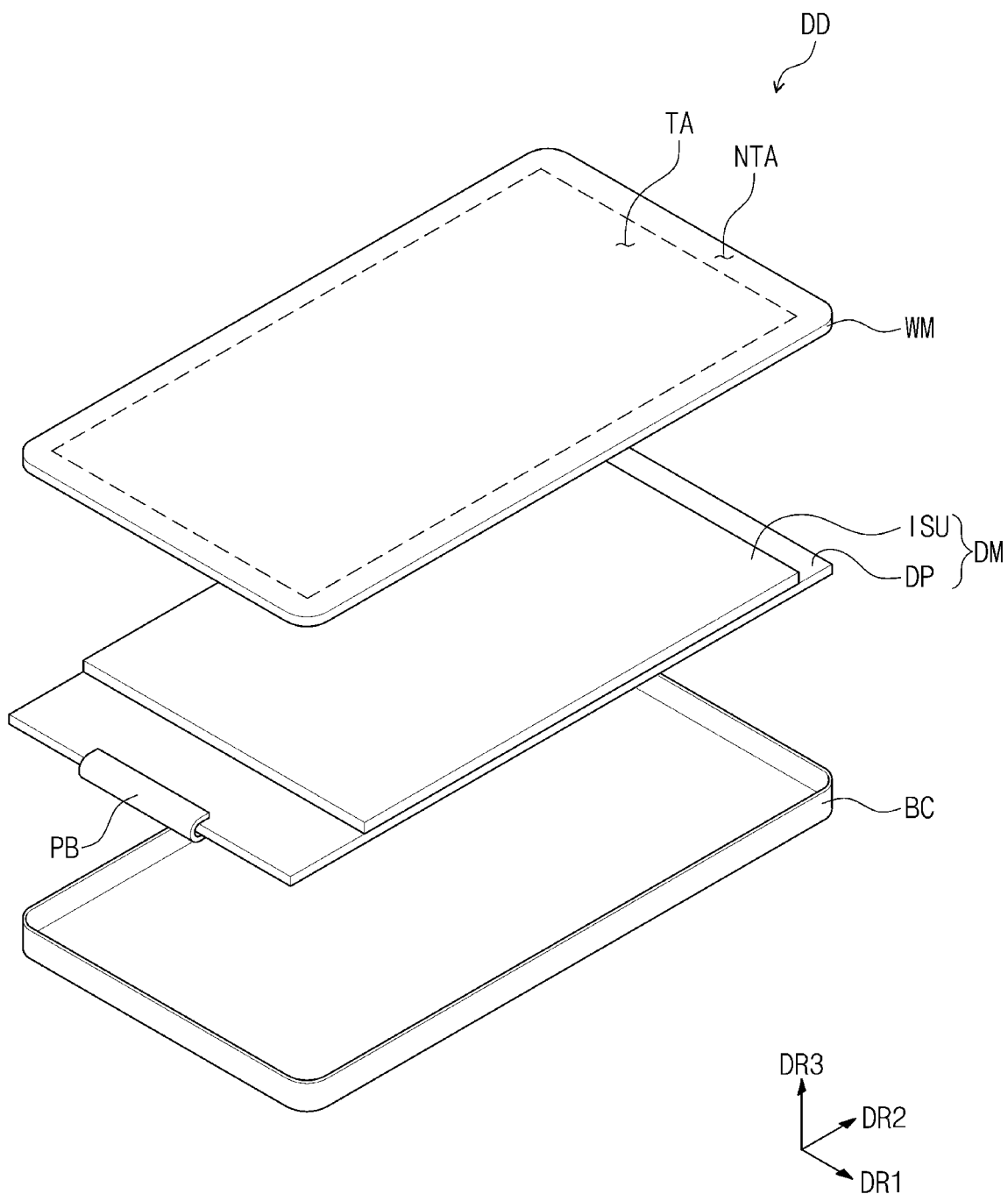
FIG. 1B is an exploded perspective view illustrating the display device according to an embodiment of the inventive concept.
Figure 2:
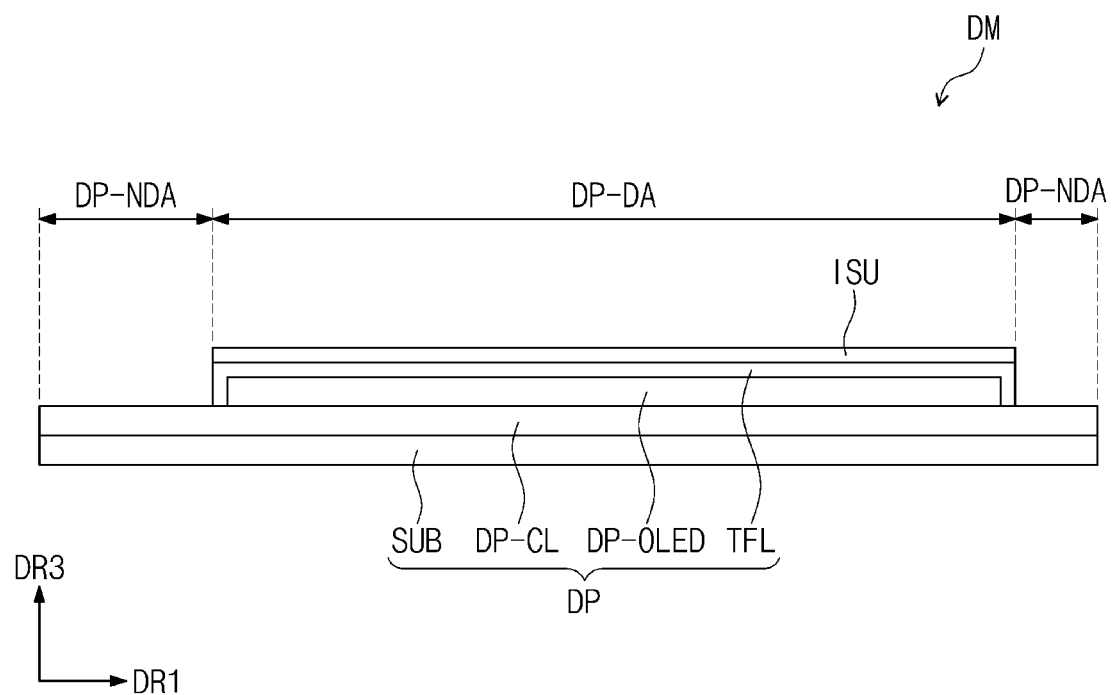
FIG. 2 is a cross-sectional view illustrating a display module according to an embodiment of the inventive concept.

FIG. 1A is a perspective view illustrating a display device according to an embodiment of the inventive concept. FIG. 1B is an exploded perspective view illustrating the display device according to an embodiment of the inventive concept. FIG. 2 is a cross-sectional view illustrating a display module according to an embodiment of the inventive concept.

In this specification, a display device DD applicable to a mobile phone terminal is illustrated as an example. Although not shown, as electronic modules mounted on a main board, a camera module, a power module, etc. are disposed on a bracket/a case in conjunction with the display device DD, the mobile phone terminal may be provided. The display device DD according to an embodiment of the inventive concept may be used for large-sized electronic devices such as televisions and monitors and small and medium-sized electronic devices such as tablet computers, navigation units for vehicles, game consoles, and smart watches.

Referring to FIG. 1A, the display device DD may display an image IM through a display surface DD-IS. In FIG. 1A, icon images are illustrated as an example of the image IM. The display surface DD-IS is parallel to a plane defined by a first direction DR1 and a second direction DR2. A normal direction of the display surface DD-IS, i.e., a thickness direction of the display device DD, indicates a third direction DR3. In this specification, an expression of "when viewed from a plane or on a plane" may represent a case when viewed in the third direction DR3. Hereinafter, a front surface (or top surface) and a rear surface (or bottom surface) of each of members or units are distinguished by the third direction DR3. However, directions indicated by the first to third directions DR1, DR2, and DR3 may be a relative concept, and converted with respect to each other, e.g., converted into an opposite direction.

Also, the display surface DD-IS includes a display area DD-DA on which the image IM is displayed and a non-display area DD-NDA disposed adjacent to the display area DD-DA. The non-display area DD-NDA may be an area on which an image is not displayed. However, the embodiment of the inventive concept is not limited thereto. For example, the non-display area DD-NDA may be adjacent to one side of the display area DA, or omitted.

Referring to FIG. 1B, the display device DD may include a window WM, a display module DM, a circuit board PB, and an accommodation member BC. The accommodation member BC may accommodate the display module DM and be coupled with the window WM.

The window WM may be disposed on the display module DM and transmit an image, which is provided from the display module DM, to the outside. The window WM includes a transmission area TA and a non-transmission area NTA. The transmission area TA may overlap the display area DD-DA and have a shape corresponding to the display area DD-DA. The image IM displayed on the display area DD-DA of the display device DD may be seen from the outside through the transmission area TA of the window WM.

The non-transmission area NTA may overlap the non-display area DD-NDA and have a shape corresponding to the non-display area DD-NDA. The non-transmission area NTA may have a relatively lower light transmittance than that of the transmission area TA. However, the embodiment of the inventive concept is not limited thereto. For example, the non-transmission area NTA may be omitted.

The window WM may be made of glass, sapphire, and plastic. Also. Although the window WM is illustrated as a single layer, the window WM may include a plurality of layers. The window WM may include a base layer and at least one printed layer disposed on a rear surface of the base layer and overlapping the non-transmission area NTA. The printed layer may have a predetermined color. For example, the printed layer may have a black color or another color besides the black color.

The display module DM is disposed between the window WM and the accommodation member BC. The display module DM includes a display panel DP and an input sensing layer ISU. The display panel DP may generate an image and transmit the generated image to the window WM.

According to an embodiment of the inventive concept, the display panel DP may be a light emitting display panel. However, the embodiment of the inventive concept is not limited thereto. For example, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot and a quantum rod. Hereinafter, the display panel DP will be described as an organic light emitting display panel.

Hereinafter, the display panel DP according to an embodiment of the inventive concept will be described as an organic light emitting display panel. However, the embodiment of the inventive concept is not limited thereto. For example, various display panels may be applied according to embodiments.

In detail, referring to FIG. 2, the display panel DP includes a substrate SUB, a circuit element layer DP-CL disposed on the substrate SUB, a display element layer DP-OLED, and an insulation layer TFL.

The display panel DP includes a display area DP-DA and a non-display area DP-NDA. The display area DP-DA of the display panel DP corresponds to the display area DD-DA in FIG. 1A or the transmission area TA in FIG. 1B, and the non-display area DP-NDA corresponds to the non-display area DD-NDA in FIG. 1A or the non-transmission area NTA in FIG. 1B.

The substrate SUB may include a plastic substrate, a glass substrate, a metal substrate, or an organic/inorganic composite substrate.

The circuit element layer DP-CL includes at least one intermediate insulation layer and a circuit element. The intermediate insulation layer includes at least one intermediate inorganic layer and at least one intermediate organic layer. The circuit element includes signal lines, a driving circuit of a pixel, etc.

The display element layer DP-OLED includes a plurality of organic light emitting diodes. The display element layer DP-OLED may further include an organic layer such as a pixel defining layer. According to another embodiment, when the display panel is a liquid crystal display panel, the display element layer may be provided as a liquid crystal layer.

The insulation layer TFL seals the display element layer DP-OLED. For example, the insulation layer TFL may be a thin-film encapsulation layer. The insulation layer TFL protects the display element layer DP-OLED from foreign substances such as moisture, oxygen, and dust particles. However, the embodiment of the inventive concept is not limited thereto. For example, an encapsulation substrate may be provided instead of the insulation layer TFL. In this case, the encapsulation substrate may face the substrate SUB with the circuit element layer DP-CL and the display element layer DP-OLED therebetween.

The input sensing layer ISU may be disposed between the window WM and the display panel DP. The input sensing layer ISU may detect an input applied from the outside. The input applied from the outside may be provided in various types. For example, the external input includes various types of external inputs such as a portion of a user's body, a stylus pen, light, heat, or pressure. Also, in addition to the contact input generated by a portion of the user's body such as user's hands, a space touch (e.g., hovering) generated by being approached or adjacent may be one type of the input.

The input sensing layer ISU may be directly disposed on the display panel DP. In this specification, an expression "a component A is disposed directly on a component B" represents that an additional adhesive layer is not disposed between the component A and the component B. In an embodiment, the input sensing layer ISU may be prepared by a continuous process in conjunction with the display panel DP. However, the embodiment of the inventive concept is not limited thereto. For example, the input sensing layer ISU may be provided as an individual panel and coupled with the display panel DP through an adhesive layer. For another example, the input sensing layer ISU may be omitted.

Referring to FIG. 1B again, the circuit board PB may be connected to one end of the display panel DP and electrically connected to the circuit element layer DP-CL in FIG. 2. According to an embodiment of the inventive concept, the circuit board PB may be bonded to one portion of the display panel DP, which overlaps the non-display area DP-NDA.

Although not shown, a driving chip may be disposed on the display panel DP to overlap the non-display area DP-NDA. For example, the driving chip may generate a driving signal necessary to operate the display panel DP on the basis of a control signal transmitted from the circuit board PB. The driving chip may transmit the generated driving signal to the circuit element layer DP-CL of the display panel DP. The driving chip may be also disposed on the display panel DP through an adhesive member according to an embodiment of the inventive concept.

Figure 3:
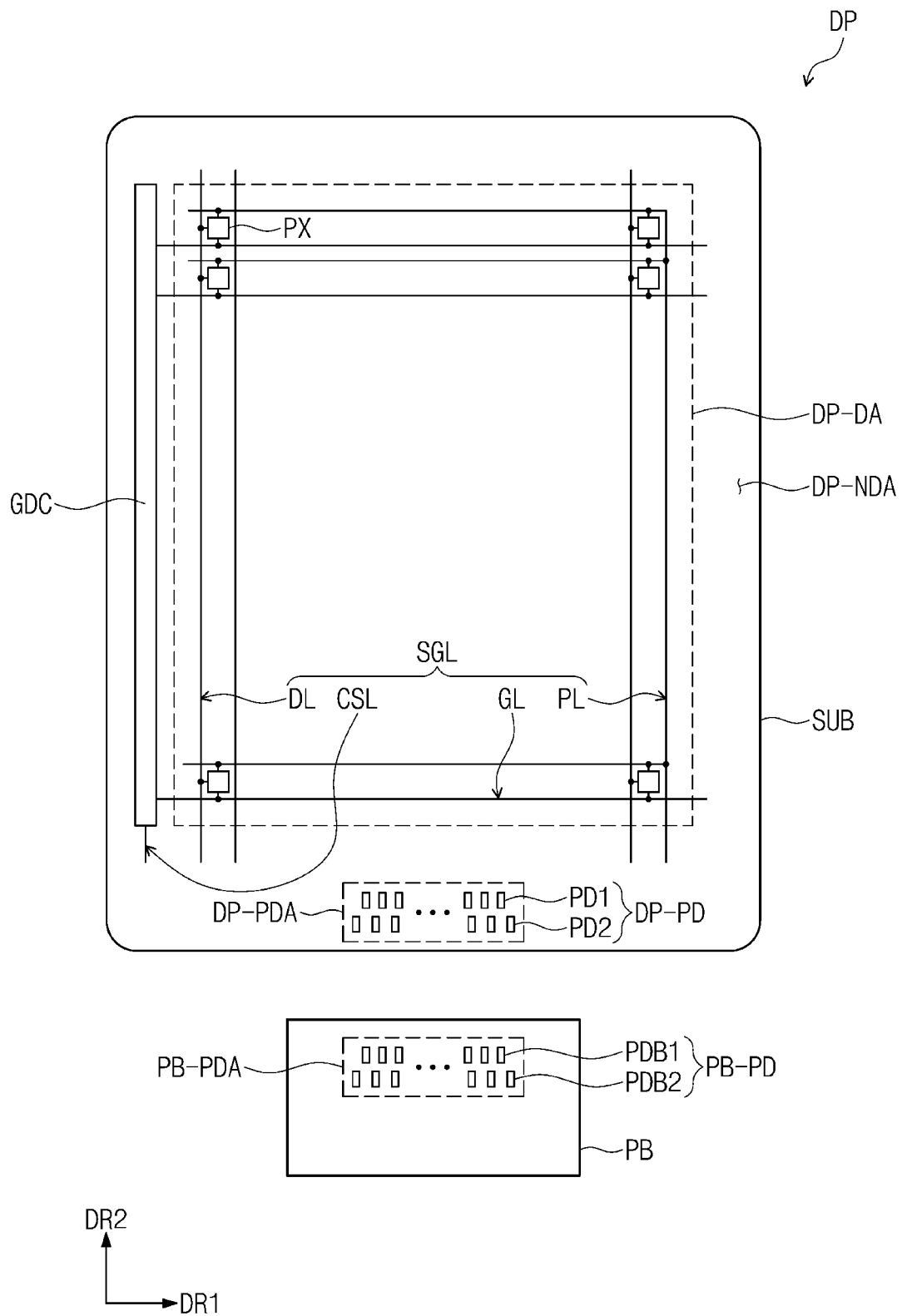
FIG. 3 is a plan view illustrating a display panel according to an embodiment of the inventive concept.
Figure 4:
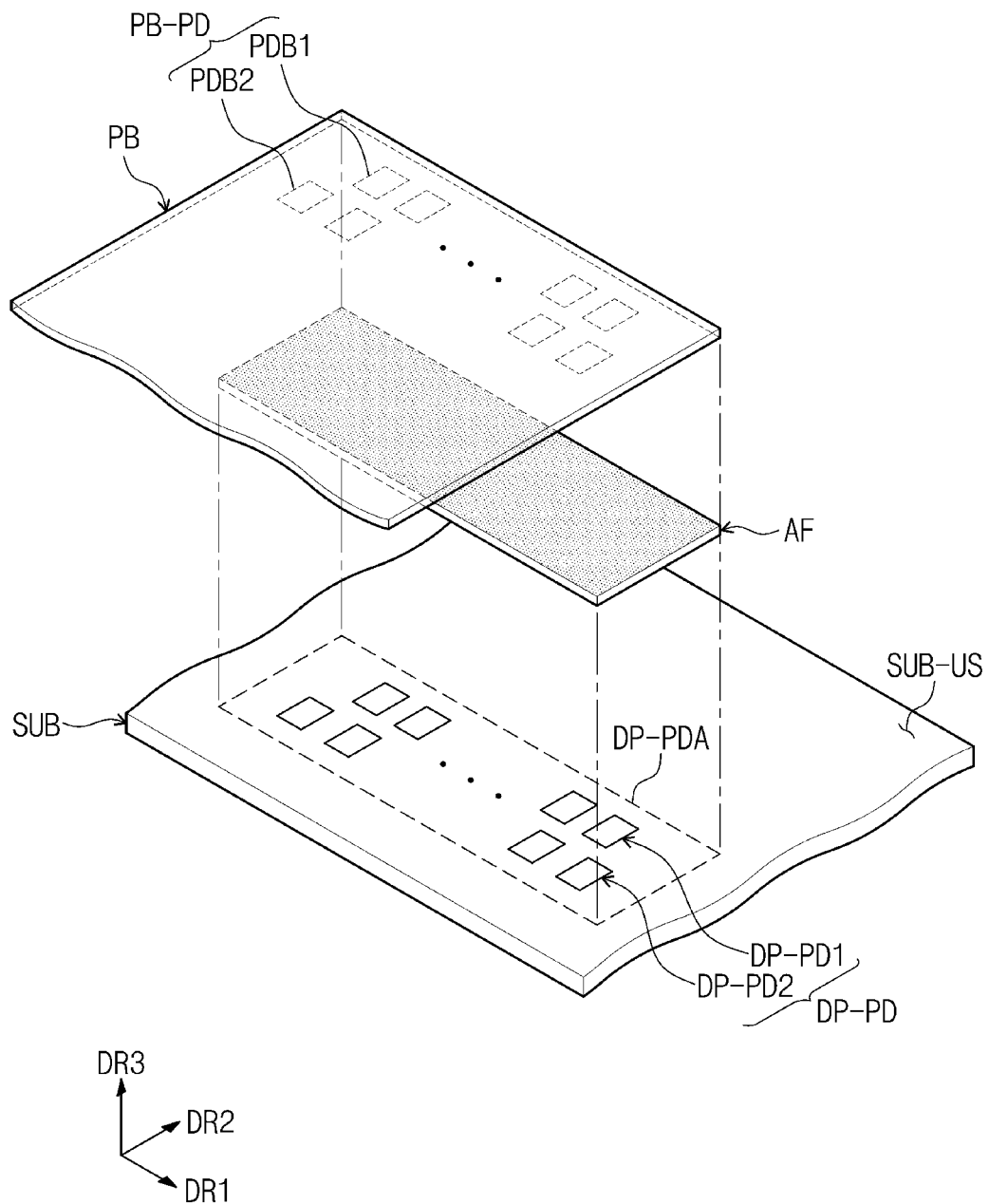
FIG. 4 is an exploded perspective view illustrating the display device according to an embodiment of the inventive concept.

FIG. 3 is a plan view illustrating the display panel according to an embodiment of the inventive concept. FIG. 4 is an exploded perspective view illustrating the display device according to an embodiment of the inventive concept.

Referring to FIG. 3, the display panel DP may include a driving circuit GDC, a plurality of signal lines SGL, a plurality of pads DP-PD, a plurality of circuit pads PB-PD, and a plurality of pixels PX (hereinafter, referred to as pixels). The pixels PX are disposed on the display area DP-DA. Each of the pixels PX includes an organic light emitting diode and a pixel driving circuit connected thereto. The driving circuit GDC, the signal lines SGL, the pads DP-PD, the circuit pads PB-PD, and the pixel driving circuit may be contained in the circuit element layer DP-CL in FIG. 2.

In this specification, the display panel DP may be described as a display substrate, and the display substrate may include the substrate SUB and the plurality of pads DP-PD disposed on the substrate SUB.

The driving circuit GDC sequentially outputs gate signals to a plurality of gate lines GL. The driving circuit GDC may further output another control signal to the pixels PX. The driving circuit GDC may include a plurality of thin-film transistors that are formed through the same process as the driving circuit of the pixels PX, e.g., a low temperature polycrystalline silicon (LTPS) process or a low temperature polycrystalline oxide (LTPO) process.

The signal lines SGL include gate lines GL, data lines DL, a power line PL, and a control signal line CSL. The gate lines GL are connected to the corresponding pixels PX of the pixels PX, respectively, and the data lines DL are connected to the corresponding pixels PX of the pixels PX, respectively. The power line PL is connected to the pixels PX. The control signal line CSL may provide control signals to a scan driving circuit. The signal lines SGL may be electrically connected to the pads DP-PD, respectively.

The pads DP-PD may overlap the non-display area DP-NDA and be disposed on the base substrate SUB. The pads DP-PD include first pads PD1 arranged in a first row along the first direction DR1 and second pads PD2 arranged in a second row in the first direction DR1. The first pads PD1 and the second pads PD2 may be arranged in different rows from each other.

Hereinafter, in this specification, an area of the non-display area DP-NDA, on which the pads DP-PD are disposed, is defined as a pad area DP-PDA. Also, the pad area DP-PDA is described to include a first pad area on which first pads PD1 are arranged and a second pad area on which second pads PD2 are arranged.

According to an embodiment of the inventive concept, the first pad area on which the first pads PD1 are arranged may be closer to the display area DP-DA than the second pad area on which the second pads PD2 are arranged. Also, the second pad area on which the second pads PD2 are arranged may be closer to an end of the base substrate SUB than the first pad area on which the first pads PD1 are arranged.

The circuit board PB may be bonded to a portion of the base substrate SUB and electrically connected to the circuit element layer DP-CL. The circuit board PB may be rigid or flexible. When the circuit board PB is flexible, the circuit board PB may be provided as a flexible printed circuit board.

The circuit board PB includes a plurality of circuit pads PB-PD that are to be electrically connected to the pads DP-PD of the display panel DP, respectively. Hereinafter, in this specification, an area, on which the circuit pads PB-PD are disposed, is defined as a circuit pad area PB-PDA.

The circuit pads PB-PD include first circuit pads PDB1 and second circuit pads PDB2. The first circuit pads PDB1 may be electrically connected to the first pads PD1 while facing each other, respectively, and the second circuit pads PDB2 may be electrically connected to the second pads PD2 while facing each other, respectively. Particularly, the circuit pads PB-PD and the pads DP-PD according to an embodiment of the inventive concept may be electrically bonded to each other through a conductive adhesive member.

Referring to FIG. 4, the pads DP-PD of the display panel DP and the circuit pads PB-PD of the circuit board PB may be electrically bonded through an adhesive member AF having conductivity. For example, the adhesive member AF may be provided as an anisotropic conductive film (hereinafter, referred to as ACF).

Specifically, the adhesive member AF may be disposed between a top surface SUB-US of the base substrate SUB corresponding to the pad area DP-PDA and the circuit board PB corresponding to the circuit pad area PB-PDA. On a plane, the adhesive member AF has an area corresponding to that of each of the pad area DP-PDA and the circuit pad area PB-PDA. However, the embodiment of the inventive concept is not limited thereto. On the plane, the adhesive member AF may have an area greater or less than that of the pad area DP-PDA or the circuit pad area PB-PDA.

The circuit board PB may include a first portion bonded to the top surface SUB-US of the base substrate SUB through the adhesive member AF and a second portion facing the other surface of the base substrate SUB. That is, the circuit board PB may have a flexible property and be bent along a side surface of the base substrate SUB.

Although not shown, a driving chip may be further provided on the top surface SUB-US of the base substrate SUB. In this case, the display panel DP may further include driving pads that are electrically connected to the driving chip, and the driving pads may be disposed between the pad area DP-PDA and the display area DP-DA in FIG. 3. Particularly, the driving chip and the driving pads may be electrically bonded through the adhesive member AF described in an embodiment of the inventive concept.

Figure 5:
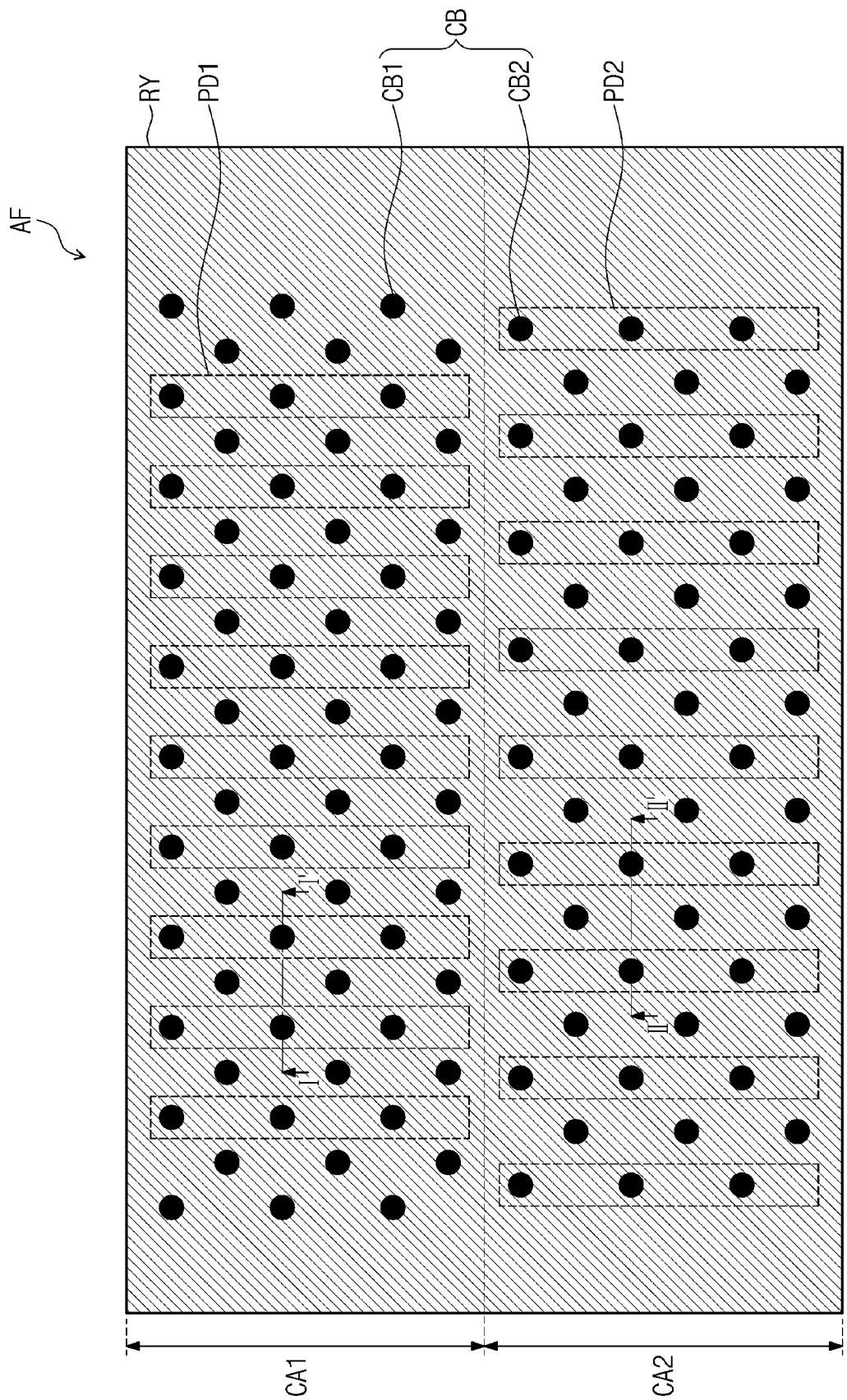
FIG. 5 is a plan view illustrating an adhesive member according to an embodiment of the present invention.

FIG. 5 is a plan view illustrating the adhesive member according to an embodiment of the present invention.

Referring to FIG. 5, the adhesive member AF includes an adhesive layer RY and a plurality of conductive balls CB distributed in the adhesive layer RY. The adhesive layer RY may be provided as an adhesive resin having a predetermined thickness. The conductive balls CB may be distributed with a predetermined pattern in the adhesive layer RY.

According to an embodiment of the inventive concept, the adhesive layer RY may be divided into a first conductive area CA1 and a second conductive area CA2. The first conductive area CA1 may be an area overlapping the first pad area on which the first pads PD1 of the pads DP-PD of the display panel DP are arranged, and the second conductive area CA2 may be an area overlapping the second pad area on which the second pads PD2 of the pads DP-PD of the display panel DP are arranged.

The conductive balls CB include first conductive balls CB1 distributed in the first conductive area CA1 and second conductive balls CB2 distributed in the second conductive area CA2. The first pads PD1 may be electrically bonded to the first circuit pads PDB1 through the first conductive balls CB1, and the second pads PD2 may be electrically bonded to the second circuit pads PDB2 through the second conductive balls CB2. According to an embodiment of the inventive concept, the first conductive balls CB1 and the second conductive balls CB2 may have the same shape as each other.

The adhesive member AF may be disposed between the circuit pad area PB-PDA of the circuit board PB and the pad area DP-PDA of the display panel DP, and then the pads DP-PD of the display panel DP and the circuit pads PB-PD of the circuit board PB may be compressed to the adhesive member AF through an external pressure and a curing process. As the adhesive layer RY is compressed by the circuit board PB and the base substrate SUB, a pattern of the conductive balls CB, which are distributed with a predetermined pattern in the adhesive layer RY, may be partially distorted.

For example, the circuit board PB and the display panel DP are bonded through the adhesive member AF, a pattern of the second conductive balls CB2 arranged in the second conductive area CA2 may be distorted more than that of the first conductive balls CB1 arranged in the first conductive area CA1. In this case, as the pattern of the second conductive balls CB2 is distorted, a short circuit between neighboring two pads may happen.

According to an embodiment of the inventive concept, the first conductive balls CB1 arranged in the first conductive area CA1 may have a first density greater than a second density of the second conductive balls CB2 arranged in the second conductive area CA2. In other words, the number of the first conductive balls CB1 arranged in the first conductive area CA1 may be greater than that of the second conductive balls CB2 arranged in the second conductive area CA2. Here, the first conductive area CA1 overlapping the first pads PD1 may have the substantially same planar area as the second conductive area CA2 overlapping the second pads PD2.

Particularly, according to an embodiment of the inventive concept, the second density of the second conductive balls CB2 arranged in the second conductive area CA2 may be equal to or greater than about 50% and equal to or less than about 90% of the first density of the first conductive balls CB1 arranged in the first conductive area CA1. That is, as the density of the second conductive balls CB2 arranged in the second conductive area CA2 is less than that of the first conductive balls CB1 arranged in the first conductive area CA1, a possibility of generation of a short circuit between the second pads PD2 or the second circuit pads PDB2 may be reduced.

According to an embodiment of the inventive concept, a first gap between the first pads PD1 arranged in the first pad area may be different from a second gap between the second pads PD2 arranged in the second pad area. For example, the second gap between two neighboring second pads of the second pads PD2 may be greater than the first gap between two neighboring first pads of the first pads PD1. Also, each of the second pads PD2 arranged in the second pad area may have a width greater than that of each of the first pads PD1 arranged in the first pad area.

Thus, as the second gap between the second pads PD2 arranged in the second pad area is greater than the first gap between the first pads PD1 arranged in the first pad area, a possibility of generation of a short circuit between the second pads PD2 by the second conductive balls CB2 may be reduced.

Also, a third gap between the first circuit pads PDB1 facing the first pads PD1 may be different from a fourth gap between the second circuit pads PDB2 facing the second pads PD2. For example, the fourth gap between two neighboring second circuit pads of the second circuit pads PDB2 may be greater than the third gap between two neighboring first circuit pads of the first circuit pads PDB1. Each of the second circuit pads PDB2 may have a width greater than that of each of the first circuit pads PDB1. Through this, a possibility of generation of a short circuit between the second circuit pads PDB2 by the second conductive balls CB2 may be reduced.

As described above, as the second conductive balls CB2 overlapping the second conductive area CA2 have a density less than that of the first conductive balls CB1 overlapping the first conductive area CA1, a possibility of generation of a short circuit between the second pads PD2 or the second circuit pads PDB2 may be reduced. Also, according to an embodiment of the inventive concept, as the width of each of the second pads PD2 is greater than that of each of the first pads PD1, reliability of connection between the second pads PD2 and the second circuit pads PDB2 through the second conductive balls CB2 may be improved.

Although the first density of the first conductive balls CB1 arranged in the first conductive area CA1 is greater than the second density of the second conductive balls CB2 arranged in the second conductive area CA2, the embodiment of the inventive concept is not limited thereto. On the contrary, the first density of the first conductive balls CB1 arranged in the first conductive area CA1 may be less than the second density of the second conductive balls CB2 arranged in the second conductive area CA2. In this case, a possibility of generation of a short circuit between the first pads PD1 or the first circuit pads PDB1 connected through the first conductive balls CB1 may be reduced.

Figure 6A:
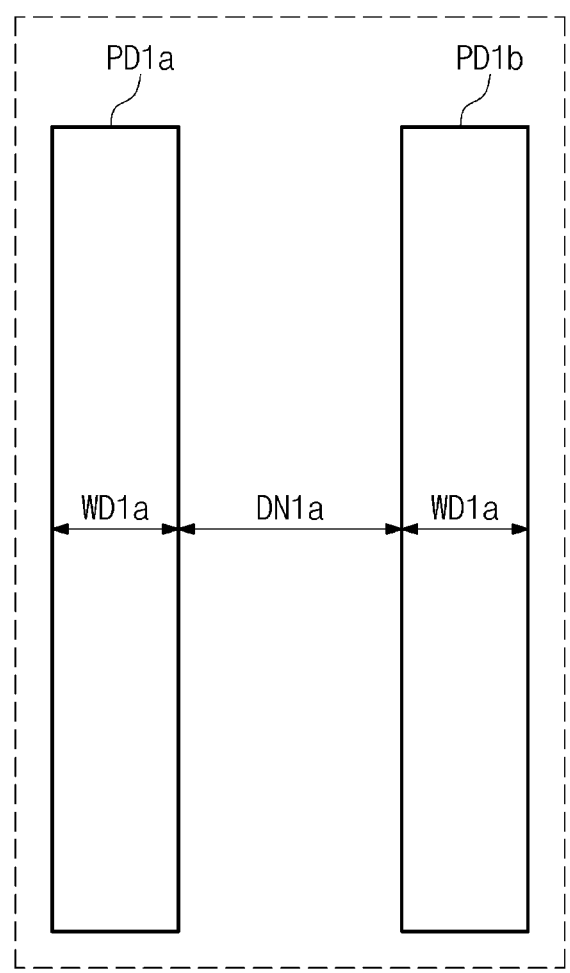
FIG. 6A is a plan view illustrating first pads contained the display panel according to an embodiment of the inventive concept.
Figure 6B:
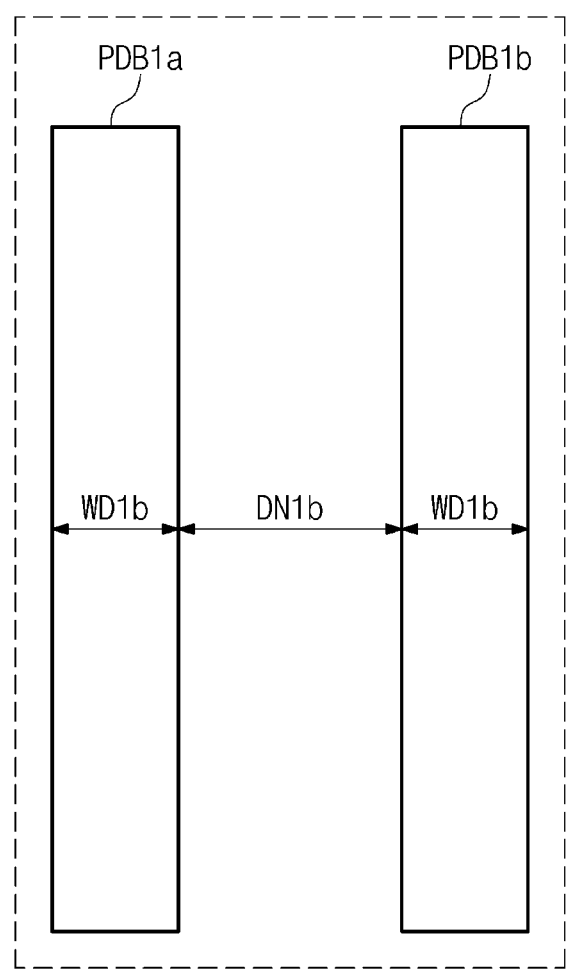
FIG. 6B is a plan view illustrating first circuit pads contained a circuit board according to an embodiment of the inventive concept.
Figure 6C:
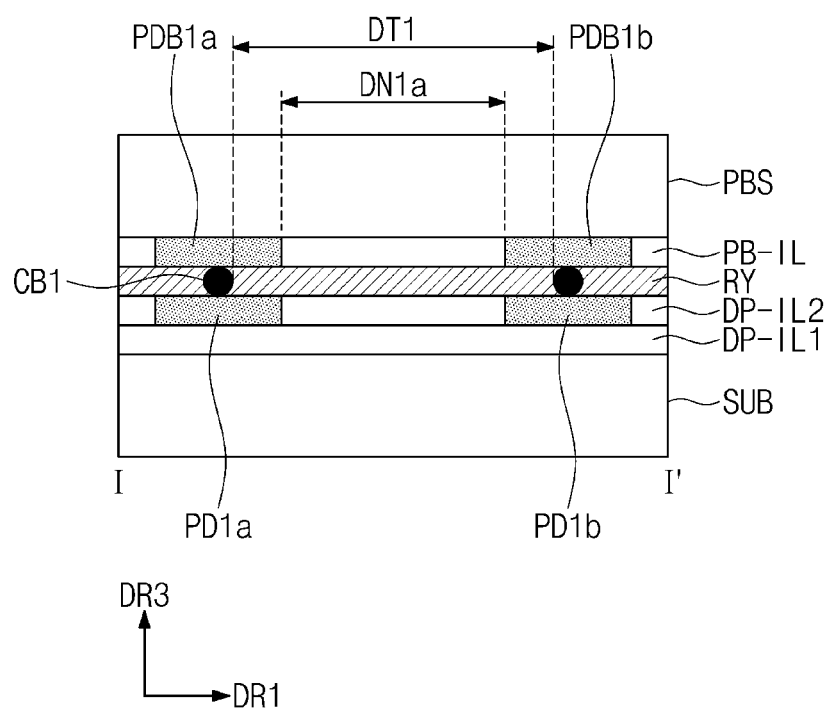
FIG. 6C is a cross-sectional view taken along line I-I' of FIG. 5.

FIG. 6A is a plan view illustrating the first pads contained in the display panel according to an embodiment of the inventive concept. FIG. 6B is a plan view illustrating the first circuit pads contained in the circuit board according to an embodiment of the inventive concept. FIG. 6C is a cross-sectional view taken along line I-I' of FIG. 5.

Referring to FIGS. 6A to 6B, two neighboring first pads PD1a and PD1b of the first pads PD1 and two neighboring first circuit pads PDB1a and PDB1b of the first circuit pads PDB1 are illustrated. The first pads PD1 in FIG. 5 may have a structure of two first pads PD1a and PD1b in FIG. 6A.

Specifically, each of the first pads PD1a and PD1b in FIG. 6A may have a first width WD1a in the first direction DR1. Also, the first pads PD1a and PD1b may each extend in the second direction DR2 and be spaced a first gap DN1a from each other in the first direction DR1. The first circuit pads PDB1a and PDB1b in FIG. 6B may each have a second width WD1b in the first direction DR1 and be spaced a second distance DN1b from each other in the first direction DR1.

For example, the first width WD1a of the first pads PD1a and PD1b and the second width WD1b of the first circuit pads PDB1a and PDB1b may be substantially the same as each other. For example, the first gap DN1a between the first pads PD1a and PD1b and the second gap DN1b between the first circuit pads PDB1a and PDB1b may be substantially the same as each other. In this specification, an expression 'distances between components or widths of components are the same as each other' may represent a value including an error range in a process.

However, the embodiment of the inventive concept is not limited thereto. For example, the width of each of the first circuit pads PDB1a and PDB1b and the width of each of the first pads PD1a and PD1b may be different from each other, and likewise, the gap between the first pads PD1a and PD1b and the gap between the first circuit pads PDB1a and PDB1b may be different from each other.

Referring to FIG. 6C, the circuit board PB includes a substrate PBS, first circuit pads PDB1a and PDB1b, and a circuit insulation layer PB-IL. The circuit insulation layer PB-IL may be disposed on a bottom surface of the substrate PBS, and the first circuit pads PDB1a and PDB1b may be disposed in a through-hole defined in the circuit insulation layer PB-IL. The first circuit pads PDB1a and PDB1b may be exposed to the outside by the circuit insulation layer PB-IL.

The first pads PD1a and PD1b of the display panel DP may be disposed on the base substrate SUB, and at least one insulation layer may be disposed between the first pads PD1a and PD1b and the base substrate SUB. For example, as illustrated in FIG. 6C, a first insulation layer IL1 and a second insulation layer IL2 may be sequentially laminated on the base substrate SUB. The first pads PD1*a* and PD1*b* disposed on the first insulation layer IL1 may be disposed in a through-hole defined in the second insulation layer IL2. The first pads PD1*a* and PD1*b* may be exposed to the outside by the second insulation layer IL2.

According to an embodiment of the inventive concept, the first conductive balls CB1 overlapping the first conductive area CA1 of the adhesive layer RY may be divided into a plurality of first row groups arranged in the first direction DR1 while being spaced a first spaced distance DT1 from each other. As illustrated in FIG. 5, five first row groups are arranged in the first direction DR1 while being spaced the first spaced distance DT1 from each other in the first conductive area CA1.

Also, although the gap between the first pads PD1*a* and PD1*b* and the gap between the first circuit pads PDB1*a* and PDB1*b* are substantially the same as each other as illustrated in FIG. 6C, the gaps may be different from each other as previously described.

Figure 7A:
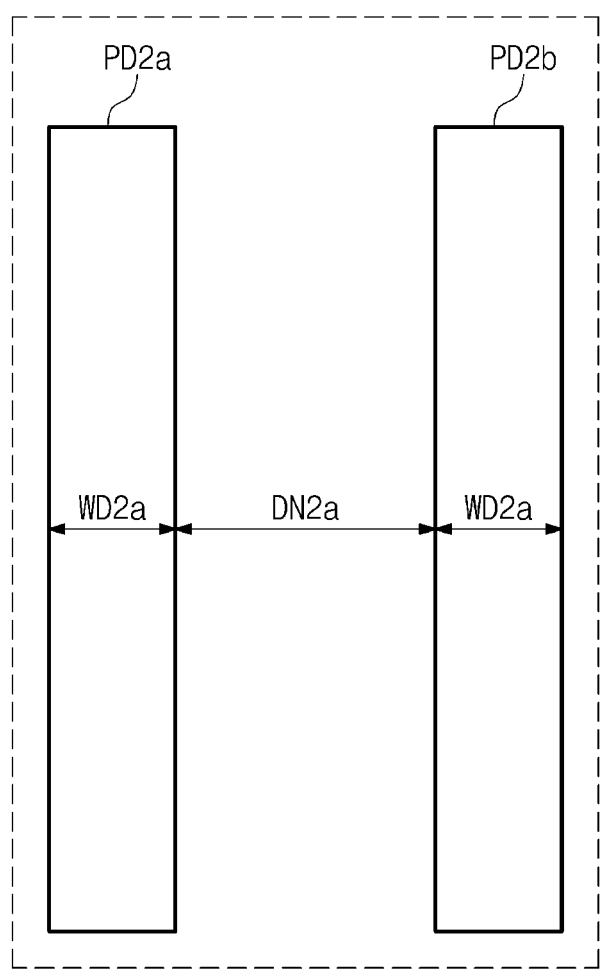
FIG. 7A is a plan view illustrating second pads contained the display panel according to an embodiment of the inventive concept.
Figure 7B:
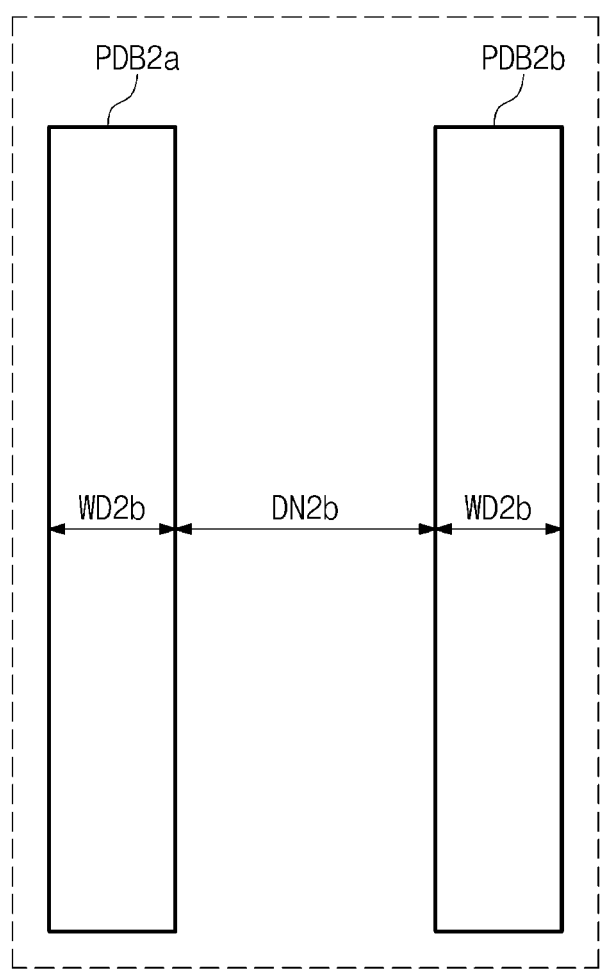
FIG. 7B is a plan view illustrating second circuit pads contained the circuit board according to an embodiment of the inventive concept.
Figure 7C:
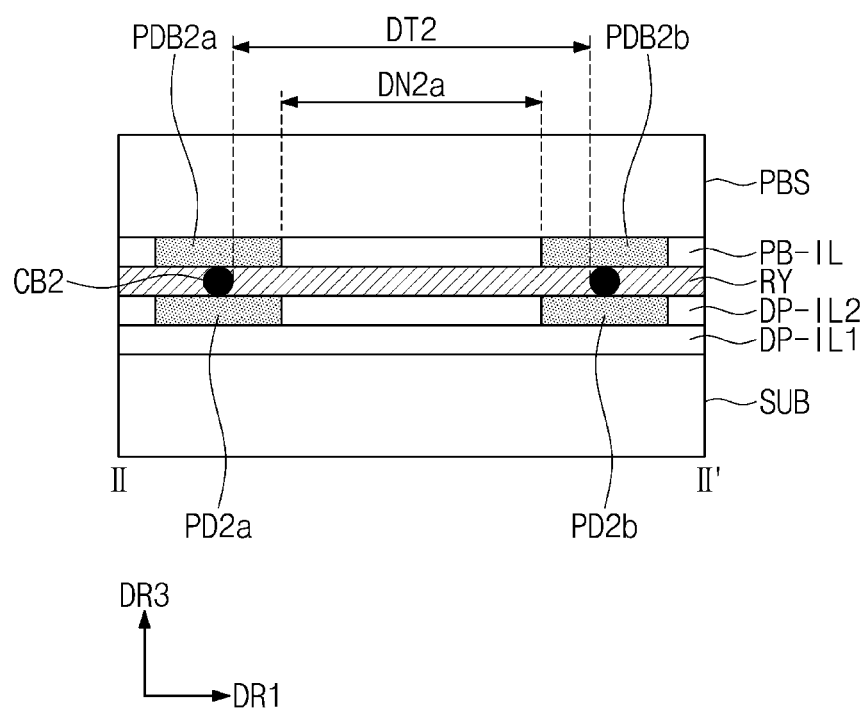
FIG. 7C is a cross-sectional view taken along line II-II' of FIG. 5.

FIG. 7A is a plan view illustrating the second pads contained in the display panel according to an embodiment of the inventive concept. FIG. 7B is a plan view illustrating the second circuit pads contained in the circuit board according to an embodiment of the inventive concept. FIG. 7C is a cross-sectional view taken along line II-II' of FIG. 5.

Referring to FIGS. 7A to 7B, two neighboring second pads PD2*a* and PD2*b* of the second pads PD2 and two neighboring second circuit pads PDB2*a* and PDB2*b* of the second circuit pads PDB2 are illustrated. The second pads PD2 in FIG. 5 may have a structure of two second pads PD2*a* and PD2*b* in FIG. 7A.

Specifically, each of the second pads PD2*a* and PD2*b* in FIG. 7A may have a third width WD2*a* in the first direction DR1. Also, the second pads PD2*a* and PD2*b* may each extend in the second direction DR2 and be spaced a third gap DN2*a* from each other in the first direction DR1. The second circuit pads PDB2*a* and PDB2*b* in FIG. 7B may each have a fourth width WD2*b* in the first direction DR1 and be spaced a fourth distance DN2*b* from each other in the first direction DR1.

The third width WD2*a* of the second pads PD2*a* and PD2*b* and the fourth width WD2*b* of the second circuit pads PDB2*a* and PDB2*b* may be substantially the same as each other. Also, the third gap DN2*a* between the second pads PD2*a* and PD2*b* and the fourth gap DN2*b* between the second circuit pads PDB2*a* and PDB2*b* may be substantially the same as each other.

According to an embodiment of the inventive concept, the third width WD2*a* of the second pads PD2*a* and PD2*b* may be greater than the first width WD1*a* of the first pads PD1*a* and PD1*b* in FIG. 6A. Also, the third gap DN2*a* between the second pads PD2*a* and PD2*b* may be greater than the first gap DN1*a* between the first pads PD1*a* and PD1*b* in FIG. 6A.

Referring to FIG. 7C, the second conductive balls CB2 overlapping the second conductive area CA2 of the adhesive layer RY according to an embodiment of the inventive concept may be divided into a plurality of second row groups arranged in the first direction DR1 while being spaced a second spaced distance DT2 from each other. As illustrated in FIG. 5, five second row groups are arranged in the first direction DR1 while being spaced the second spaced distance DT2 from each other in the second conductive area CA2.

According to an embodiment of the inventive concept, the second spaced distance DT2 between the second conductive balls CB2 in the first direction DR1 may be greater than the first spaced distance DT1 between the first conductive balls CB1 in FIG. 6C. Also, although the gap between the second pads PD2*a* and PD2*b* and the gap between the second circuit pads PDB2*a* and PDB2*b* are substantially the same as each other as illustrated in FIG. 7C, the gaps may be different from each other as previously described.

Figure 8:
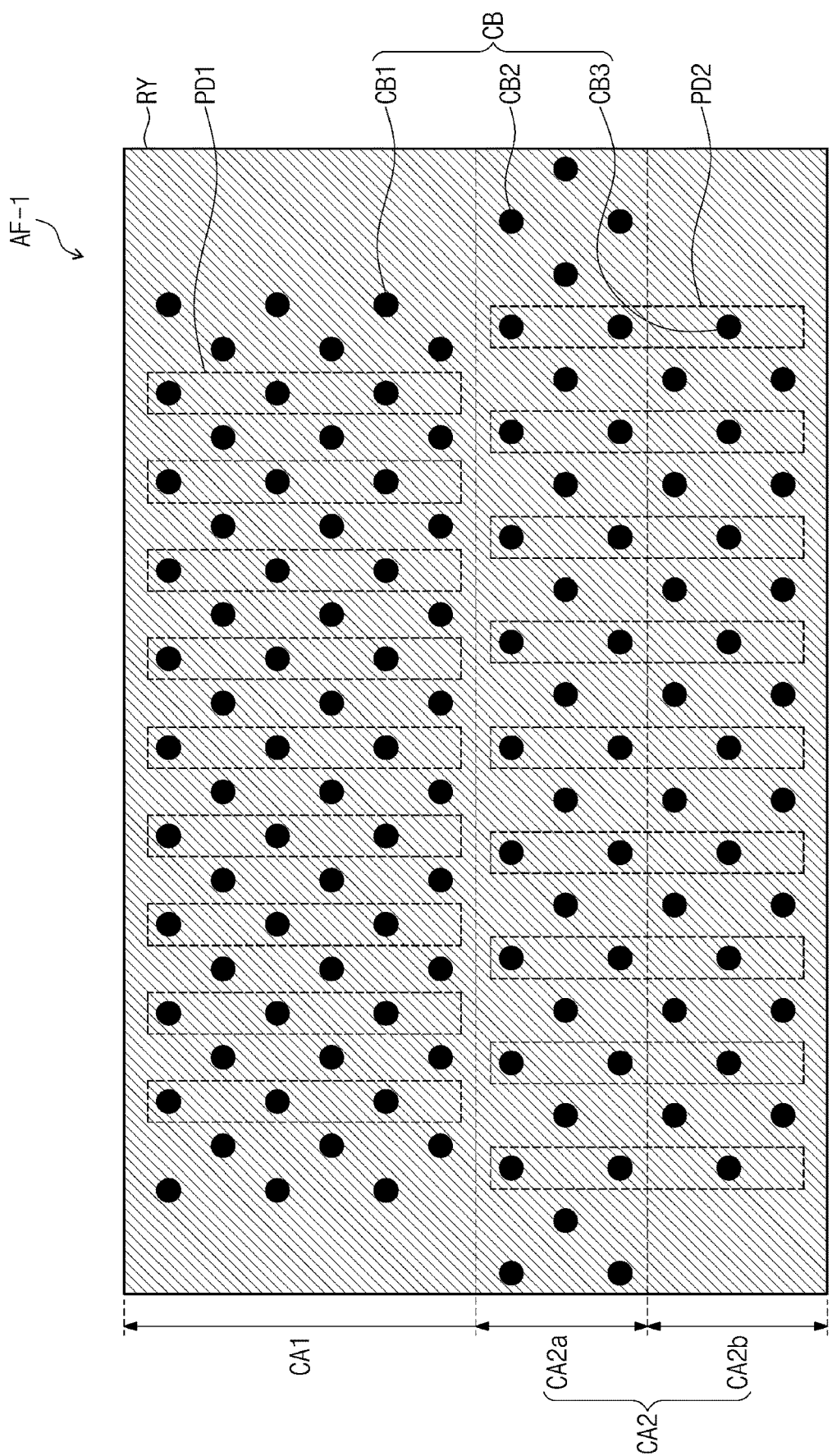
FIG. 8 is a plan view illustrating an adhesive member according to another embodiment of the inventive concept.

FIG. 8 is a plan view illustrating an adhesive member according to another embodiment of the inventive concept.

Referring to FIG. 8, an adhesive member AF includes an adhesive layer RY and a plurality of conductive balls CB distributed on the adhesive layer RY. The adhesive layer RY may be divided into a first conductive area CA1 and a second conductive area CA2.

Particularly, when compared with the adhesive member AF in FIG. 5, the second conductive area CA2 of the adhesive layer RY in FIG. 8 is divided into a first area CA2*a* and a second area CA2*b*. The first area CA2*a* may be disposed between the first conductive area CA1 and the second conductive area CA2. Here, as illustrated in FIG. 5, the first gap between the first pads PD1 overlapping the first conductive area CA1 may be less than the second gap between the second pads PD2 overlapping the second conductive area CA2. However, as illustrated in FIG. 8, a width of the first pads PD1 and a width of the second pads PD2 may be substantially the same as each other.

Specifically, the conductive balls CB include first to third conductive balls CB1, CB2, and CB3. The first conductive balls CB1 are arranged in the first conductive area CA1. The first conductive balls CB1 arranged in the first conductive area CA1 may have a first density. The second conductive balls CB2 are arranged in a first area CA2*a* of the second conductive area CA2. The second conductive balls CB2 arranged in the first area CA2*a* of the second conductive area CA2 may have a second density. The third conductive balls CB3 are arranged in a second area CA2*b* of the second conductive area CA2. The third conductive balls CB3 arranged in the second area CA2*b* of the second conductive area CA2 may have a third density.

According to an embodiment of the inventive concept, the third density may be less than each of the first density and the second density. That is, the number of the third conductive balls CB3 arranged in the second area CA2*b* may be less than the number of the first conductive balls CB1 arranged in the first conductive area CA1 or the number of the second conductive balls CB2 arranged in the first area CA2*a*.

Also, according to an embodiment of the inventive concept, the first density of the first conductive balls CB1 arranged in the first conductive area CA1 may be substantially the same as the second density of the second conductive balls CB2 arranged in the first area CA2*a*.

According to the embodiment of the inventive concept, the circuit board and the display panel may be bonded to each other through the adhesive member. Particularly, as the first conductive balls overlapping the first conductive area and the second conductive balls overlapping the second conductive area have different densities, the short circuit between the pads of the display panel may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display substrate comprising a plurality of first pads arranged in a first pad area and a plurality of second pads arranged in a second pad area, wherein the first pads and the second pads are arranged in different rows from the plurality of first pads;
a circuit board comprising a plurality of first circuit pads facing the plurality of first pads and a plurality of second circuit pads facing the plurality of second pads; and
an adhesive member between the display substrate and the circuit board and comprising an adhesive layer and a plurality of conductive balls distributed therein in a predetermined pattern without overlapping each other, the plurality of conductive balls including first conductive balls disposed in a first conductive area overlapping the first pad area and second conductive balls disposed in a second conductive area overlapping the second pad area, the first conductive area having substantially the same planar area as the second conductive area;
wherein a radius of the first conductive balls substantially the same as the radius of the second conductive ball,
wherein the first conductive balls comprise a first number of conductive balls arranged at a first density and the second conductive balls comprise a second number of conductive balls arranged at a second density less than the first density, and the first number is greater than the second number, and
wherein the first conductive balls and the second conductive balls are not disposed between the first pads and the second pads.

2. The display device of claim 1, wherein the second density is no lower than about 50% and no higher than about 90% of the first density.

3. The display device of claim 1, wherein
a first gap is defined as a gap between two neighboring pads of the plurality of first pads, and
a second gap is defined as a gap between two neighboring pads of the plurality of second pads, and
wherein the second gap is greater than the first gap.

4. The display device of claim 3, wherein
a third gap is defined as a gap between two neighboring circuit pads of the plurality of first circuit pads, and
a fourth gap is defined as a gap between two neighboring circuit pads of the plurality of second circuit pads, and
wherein the fourth gap is greater than the third gap.

5. The display device of claim 4, wherein
the first gap corresponds to the third gap, and
the second gap corresponds to the fourth gap.

6. The display device of claim 1, wherein the display substrate defines a display area and a non-display area; and
the first pad area is closer to the display area than the second pad area.

7. The display device of claim 1, wherein
the plurality of first pads are arranged along a first direction and two neighboring pads of the plurality of first pads are spaced from each other in the first direction, and
the plurality of second pads are arranged along the first direction and two neighboring pads of the plurality of second pads are spaced from each other in the first direction, and
wherein each of the plurality of second pads is wider than each of the plurality of first pads.

8. The display device of claim 7, wherein each of the plurality of second circuit pads is wider than each of the plurality of first circuit pads.

9. The display device of claim 1, wherein
the first conductive balls are divided into a plurality of first row groups arranged in a first direction while being spaced a first distance from each other, and
the second conductive balls are divided into a plurality of second row groups arranged in the first direction while being spaced a second distance from each other.

10. The display device of claim 9, wherein the second distance is greater than the first distance in the first direction.

11. The display device of claim 1,
wherein the display substrate comprises:
a base substrate; and
a circuit element layer disposed on a top surface of the base substrate and comprising the first pads and the second pads,
wherein the plurality of second pads are closer to an end of the base substrate than the plurality of first pads in a plan view.

12. The display device of claim 11,
wherein the circuit board comprises:
a first portion facing the top surface of the base substrate; and
a second portion disposed adjacent to the first portion and facing the other surface of the base substrate.

13. A display device, comprising:
a display substrate comprising a plurality of first pads arranged in a first pad area and a plurality of second pads arranged in a second pad area, wherein the first pads and the second pads are arranged in different rows;
a circuit board comprising first circuit pads facing the first pads, respectively, and second circuit pads facing the second pads, respectively; and
an adhesive member disposed between the display substrate and the circuit board and comprising an adhesive layer and a plurality of conductive balls distributed in the adhesive layer in a predetermined pattern without overlapping each other,
wherein the conductive balls comprise a first number of conductive balls disposed in a first conductive area overlapping the first pad area and arranged at a first density, a second number of conductive balls disposed in a second conductive area overlapping a first area of the second pad area and arranged at a second density, and a third number of conductive balls disposed in a third conductive area overlapping a second area of the second pad area and arranged at a third density, the first conductive area having substantially the same planar area as the second conductive area,
wherein the first conductive ball, the second conductive ball, and the third conductive ball have a substantially same radius,
wherein the first area is disposed between the first pad area and the second area,
wherein the third density is less than each of the first density and the second density, and the third number is less than each of the first number and the second number, and
wherein the first conductive balls and the second conductive balls are not disposed between the first pads and the second pads.

14. The display device of claim 13, wherein the third density is equal to or greater than about 50% and equal to or less than about 90% of the first density or the second density.

15. The display device of claim 13, wherein
the first number of conductive balls are divided into a plurality of first row groups arranged in a first direction while being spaced a first gap from each other,
wherein the second number of conductive balls are divided into a plurality of second row groups arranged in the first direction while being spaced a second gap from each other, and
wherein the third number of conductive balls are divided into a plurality of third row groups arranged in the first direction while being spaced a third gap from each other.

16. The display device of claim 15, wherein the third gap is greater than each of the first gap and the second gap.

17. The display device of claim 13, wherein a first gap between two neighboring first pads of the first pads is less than a second gap between two neighboring second pads of the second pads.

18. The display device of claim 13, wherein the first density is substantially the same as the second density.

19. An adhesive member, comprising:
an adhesive layer comprising a first conductive area and a second conductive area, which are divided into different rows wherein the first conductive area has substantially the same planar area as the second conductive area, and
a conductive group comprising a plurality of conductive balls distributed therein in a predetermined pattern without overlapping each other, the plurality of conductive balls including first conductive balls distributed in the first conductive area and a plurality of second conductive balls distributed in the second conductive area,
wherein a radius of the first conductive ball is substantially the same as the radius of the second conductive ball,
wherein the first conductive balls comprise a first number of conductive balls arranged at a first density and the second conductive balls comprises a second number of conductive balls arranged at a second density less than the first density,
the first number is greater than the second number, and
the second density is equal to or greater than about 50% and equal to or less than about 90% of the first density.

20. The adhesive member of claim 19, wherein the first conductive balls comprise a plurality of first row groups arranged in a first direction while being spaced a first gap in a row unit from each other,
the second conductive balls comprise a plurality of second row groups arranged in the first direction while being spaced a second gap in a row unit from each other, and
the second gap is greater than first second gap.

* * * * *